(12) United States Patent
Osumi

(10) Patent No.: US 7,825,513 B2
(45) Date of Patent: Nov. 2, 2010

(54) ELECTRODE STRUCTURE IN SEMICONDUCTOR DEVICE AND RELATED TECHNOLOGY

(75) Inventor: Takatoshi Osumi, Nara (JP)

(73) Assignee: Panasonic Corporation, Osaka (JP)

( * ) Notice: Subject to any disclaimer, the term of this patent is extended or adjusted under 35 U.S.C. 154(b) by 156 days.

(21) Appl. No.: 12/197,615

(22) Filed: Aug. 25, 2008

(65) Prior Publication Data

US 2009/0057892 A1     Mar. 5, 2009

(30) Foreign Application Priority Data

Sep. 4, 2007    (JP)   ............... 2007-228987

(51) Int. Cl.
*H01L 23/48*     (2006.01)
(52) U.S. Cl. ............... 257/738; 257/737; 257/E23.021; 257/E23.069
(58) Field of Classification Search ................. 257/737, 257/738, E23.021, E23.069; 438/612–617; 228/180.22
See application file for complete search history.

(56) References Cited

U.S. PATENT DOCUMENTS

| | | | |
|---|---|---|---|
| 5,656,863 A | | 8/1997 | Yasunaga et al. |
| 5,943,597 A | * | 8/1999 | Kleffner et al. ............. 438/613 |
| 6,404,051 B1 | | 6/2002 | Ezawa et al. |
| 7,378,733 B1 | * | 5/2008 | Hoang et al. ................ 257/724 |
| 2002/0003259 A1 | | 1/2002 | Maeda et al. |
| 2003/0030142 A1 | | 2/2003 | Nakatani |

FOREIGN PATENT DOCUMENTS

| | | |
|---|---|---|
| JP | 04-196392 | 7/1992 |
| JP | 2006-019550 | 1/2006 |

* cited by examiner

*Primary Examiner*—Jasmine J Clark
(74) *Attorney, Agent, or Firm*—McDermott Will & Emery LLP (57) ABSTRACT

A first insulation film having a first opening is provided on an electrode pad of a semiconductor chip. A second insulation film having a second opening is provided on the first insulation film. A ground metallic layer which is to be in contact with the electrode pad via the first opening is provided on the first insulation film. A bump which is to be mechanically and electrically connected to the ground metallic layer is provided. Further, the above placement is made in a way that the ground metallic layer is provided in the second opening, and the ground metallic layer is provided on an inner side than an outer periphery of the electrode pad, covering the first opening.

8 Claims, 8 Drawing Sheets

$\phi_1 < \phi_s < \phi_2 < \phi_p$

FIG. 4

$\phi_2 \geqq 1.1 \times \phi_S$

FIG. 10
PRIOR ART $\phi_1 < \phi_s < \phi_p$ $\phi_s \geq \phi_2$

ELECTRODE STRUCTURE IN SEMICONDUCTOR DEVICE AND RELATED TECHNOLOGY

BACKGROUND OF THE INVENTION

1. Field of the Invention

The present invention relates to an electrode structure in a semiconductor device in which semiconductor chips are flip-chip-mounted, and a semiconductor wafer, a semiconductor device and an electronic device relating thereto.

2. Description of the Related Art

As an information communication device and an office-use electronic device are increasingly downsized and highly-functional in recent years, it is requested that an area reduction be realized and the number of external terminals for input/output be increased in a semiconductor device (semiconductor integrated circuit device or the like) which is installed in these devices. However, in the structure of a semiconductor device in which an electrode pad is formed in a periphery of a semiconductor chip and connected to an external circuit by means of a wire-bonding method, it is becoming difficult to have a compatibility between an increase in the number of external terminals and the downsizing of a semiconductor chip.

As the conventional technology for realizing these contradictory demands at the same time, such structures that are called the pad-on element structure and the flip-chip structure are increasingly often adopted. In the pad-on element structure, an electrode pad connected to outside by means of wire bonding or inner-lead bonding is formed on an active area. In the flip-chip structure, external connection terminals called bumps are formed on the electrode pad formed on the active area, and the external connection terminals are connected to an external circuit via the bumps.

Figure 5:
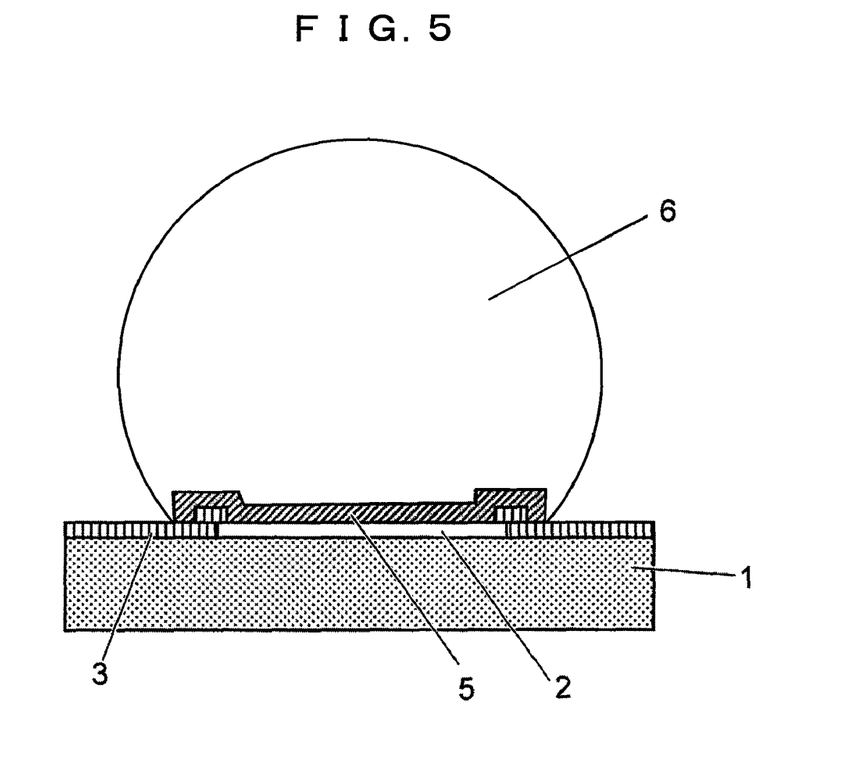
FIG. 5 is a sectional view illustrating a conventional electrode structure in a semiconductor device.
Figure 6:
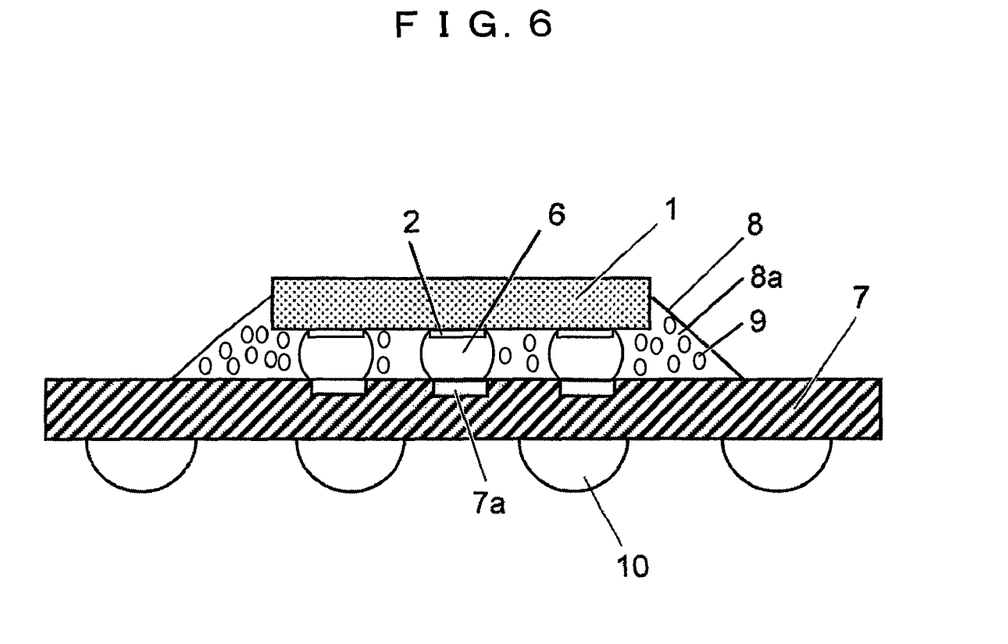
FIG. 6 is a sectional view illustrating a state where a conventional semiconductor chip is flip-chip-mounted on a wiring substrate and under-fill resin is supplied thereto.

FIG. 5 is a sectional view illustrating an electrode structure in a conventional semiconductor device of the BGA (Ball Grid Array) type. FIG. 6 is a sectional view illustrating a state where a semiconductor chip 1 shown in FIG. 5 is flip-chip-mounted on a wiring substrate 7, and under-fill resin 8 is then injected into between the semiconductor chip 1 and the wiring substrate 7. As shown in FIG. 5, an electrode pad 2 electrically connected to a semiconductor element and an insulation film 3 having an opening above the electrode pad 2 are formed on the semiconductor chip 1, and a ground metallic layer 5 is formed on an area above the electrode 2, the area including an upper portion and the opening of the insulation film 3. On the ground metallic layer 5, a metallic bump 6 made of solder is provided. As shown in FIG. 6, the semiconductor chip 1 is mounted on the wiring substrate 7 in a face-down manner, and the electrode pads 2 of the semiconductor chip 1 and electrode lands 7a of the wiring substrate 7 are mechanically and electrically connected to each other via the metallic bumps 6. The under-fill resin 8 is filled into between the metallic bumps 6 in a gap between the semiconductor chip 1 and the wiring substrate 7. The wiring substrate 7 is provided with solder balls 10 on a surface thereof opposite to a surface where the metallic bumps are formed.

The under-fill resin 8 is filled thereinto based on the following reason. In the case where the semiconductor device is subjected to the thermal history or the like, stress is applied to joining areas, more specifically, chip-side root portions of the metallic bumps 6 because a thermal expansion coefficient is different between the semiconductor chip 1 and the wiring substrate 7. In order to lessen the concentration of the stress, the under-fill resin 8 is injected into between the semiconductor chip 1 and the wiring substrate 7 to seal the gap. Thus constituted, the under-fill resin 8 is cured so that a bonding strength between the semiconductor chip 1 and the wiring substrate 7 is increased. In the under-fill resin 8, filler 9 having an appropriate size is added to resin 8a, which is a base material such as epoxy-based resin, in order for the under-fill resin 8 to obtain a thermal expansion coefficient similar to that of the semiconductor chip 1. When an amount and particle diameters of the filler 9 are adjusted, the thermal expansion coefficient is adjusted. The under-fill resin 8 also serves to prevent moisture from entering from outside and thereby improve the resistance to moisture.

Figure 7A:
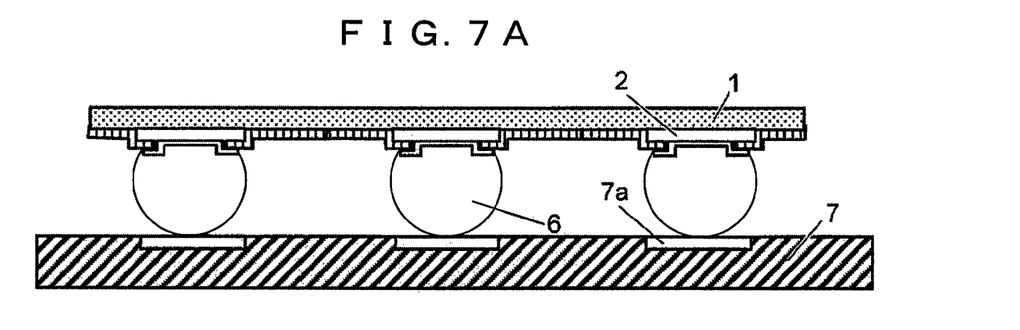
FIGS. 7A-7D are sectional views illustrating a conventional semiconductor device manufacturing process.
Figure 7B:
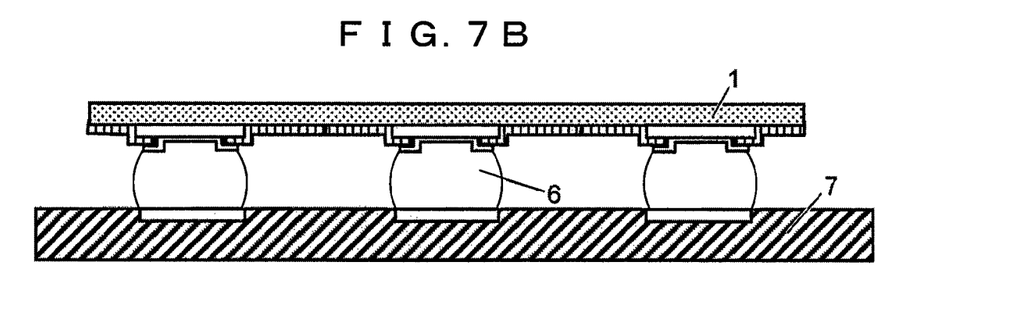
Figure 7C:
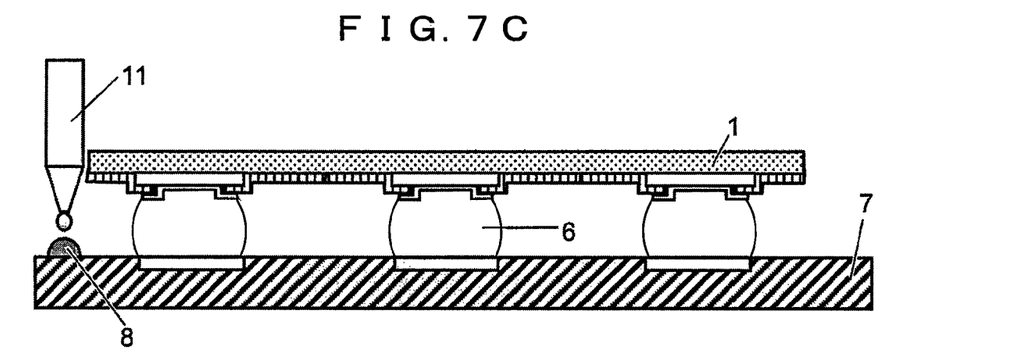
Figure 7D:
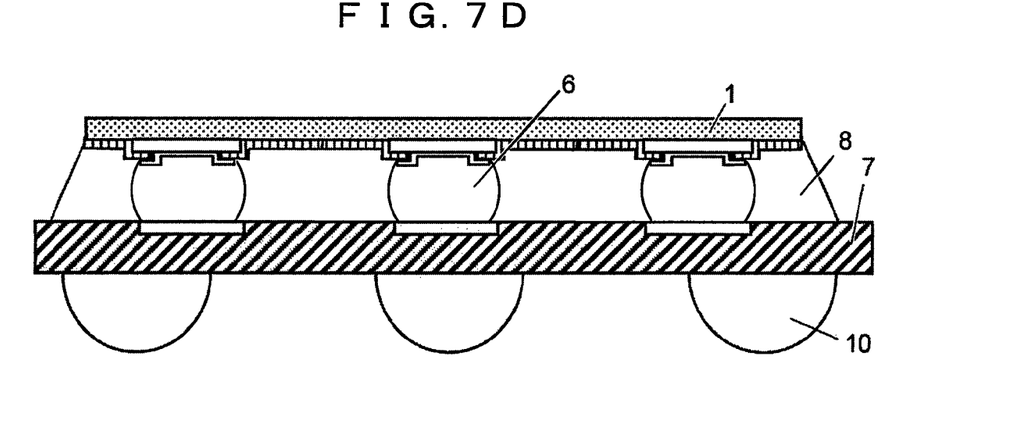

Referring to process sectional views illustrated in FIGS. 7A and 7D, a semiconductor device manufacturing method according to the before-mentioned flip-chip mounting structure is described. As shown in FIG. 7A, a semiconductor chip 1 which has metallic bumps 6 formed on an electrode pad 2 by means of the electroplating method, printing method or the like, and a wiring substrate 7 on which metallic pads 7a are formed at positions corresponding to the metallic bumps 6 are prepared. Then, the semiconductor chip 1 is flip-chip-mounted on the wiring substrate 7.

As shown in FIG. 7B, when the metallic bumps 6 of the semiconductor chip 1 are reflowed, the solder is melted and the metallic bumps 6 and the metallic pads 7a are connected to each other. After that, as shown in FIG. 7C, a gap between the semiconductor chip 1 and the wiring substrate 7 is washed, and under-fill resin 8 is injected into the gap with a dispenser 11. The under-fill resin 8 is injected from a periphery of the chip, and capillarity makes the under-fill resin 8 spread onto an entire bottom surface of the semiconductor chip 1. As a result, the gap between the semiconductor chip 1 and the wiring substrate 7 is filled with the under-fill resin 8.

After that, a heat treatment is performed so that the under-fill resin 8 is cured, and the gap is thereby sealed. Then, as shown in FIG. 7D, the solder balls 10 are provided on the metallic pad drawn to a substrate surface opposite to a surface provided with the chip, and the solder balls 10 are reflowed. As a result of these steps, the semiconductor device of the BGA type is completed.

Figure 8:
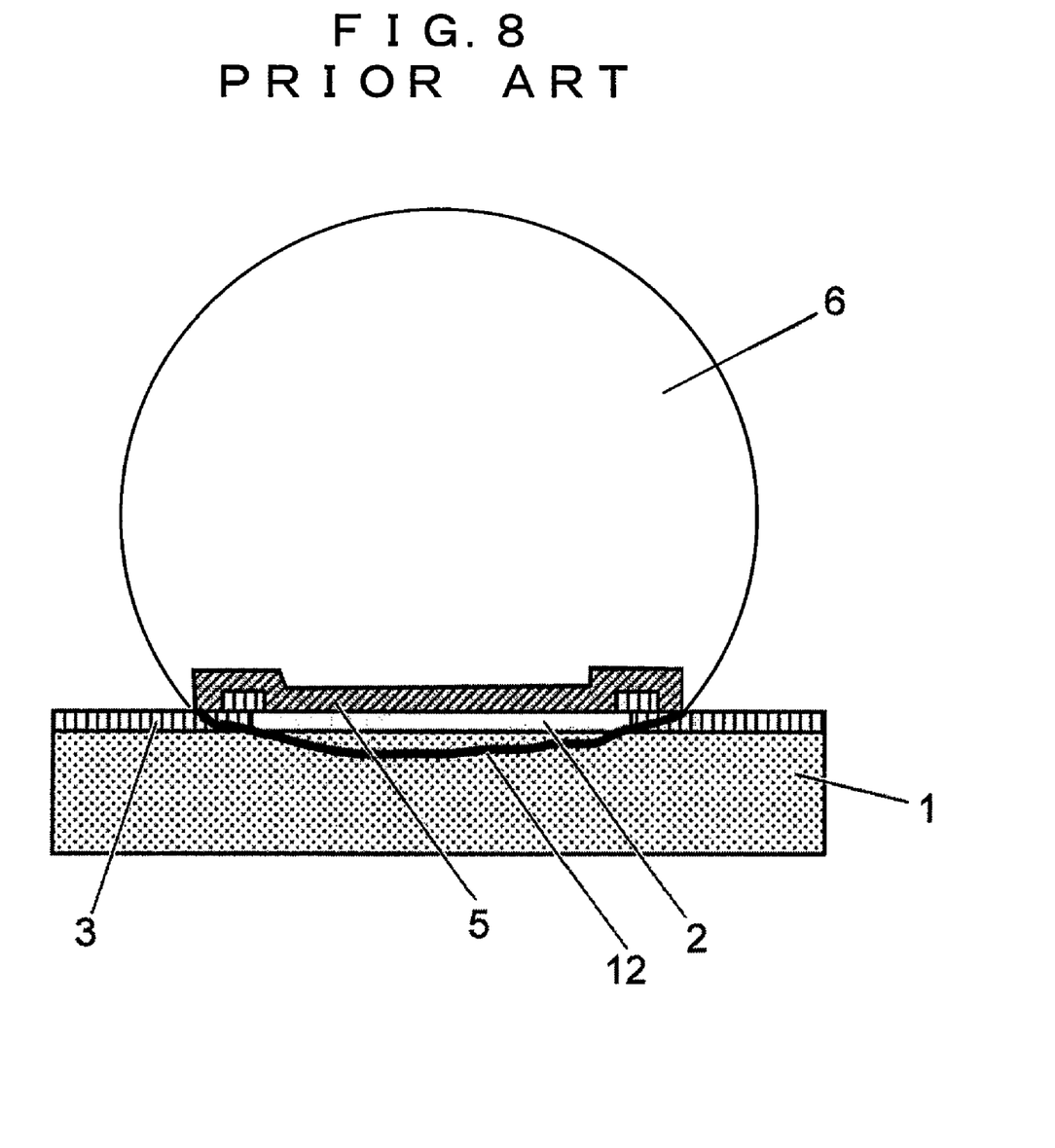
FIG. 8 is a sectional view wherein a conventional problem is illustrated.

As the semiconductor is increasingly smaller and highly-functional in recent years, however, pitches of the metallic bumps 6 become smaller, and the gap between the semiconductor chip 1 and the wiring substrate 7 becomes narrower. When the gap is smaller, the root portions of the metallic bumps 6 are subjected to more stress. As a result, a crack 12 (see the bold line) extending from the root portion of the metallic bump 6 into the semiconductor chip 1 is more likely to occur. The fact that the crack 12 is more likely to occur when the gap is smaller is based on the following reason. Because the ground metallic layer 5 is formed on an area above the electrode pad 2, the area including the upper portion and the opening of the insulation film 3, the insulation film 3 is present, but the electrode pad 2 is not present immediately below and portions of the ground metallic layer 5. Accordingly, a mechanical strength at an area immediately below the end portions of the ground metallic layer 5 is lower than that at any other areas. Therefore, the crack 12 (see the bold line) is likely to occur from the area immediately below the end portions of the ground metallic layer 5, at which the mechanical strength is lower than at any other areas and develop into the semiconductor chip 1 when a large stress is applied to the root portion of the metallic bump 6.

Figure 9A:
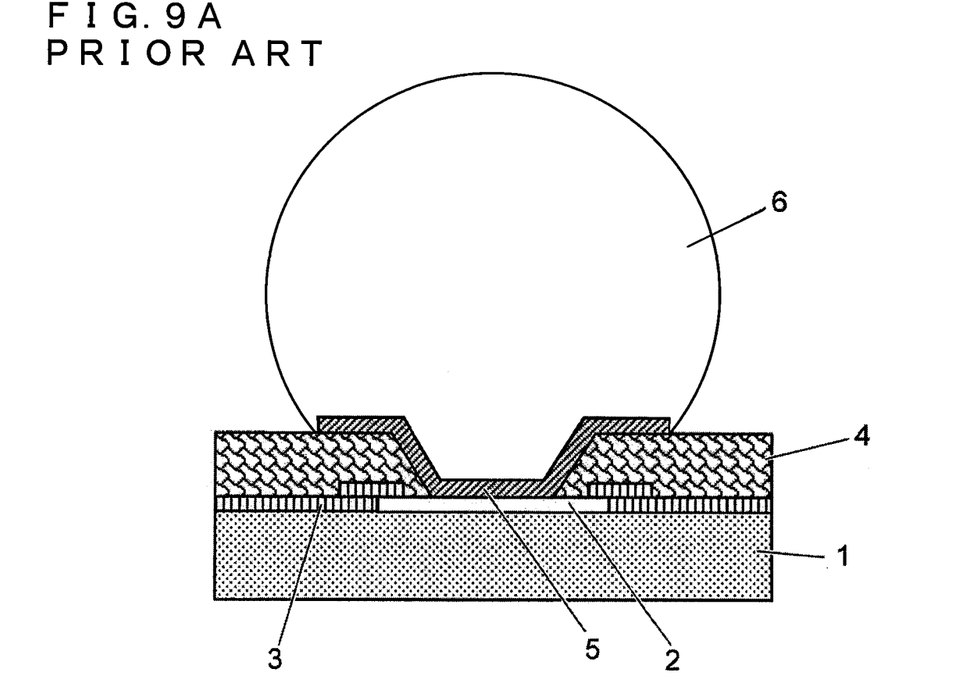
FIGS. 9A and 9B are sectional views of another conventional electrode structures in a semiconductor device, wherein conventional problems are illustrated.
Figure 9B:
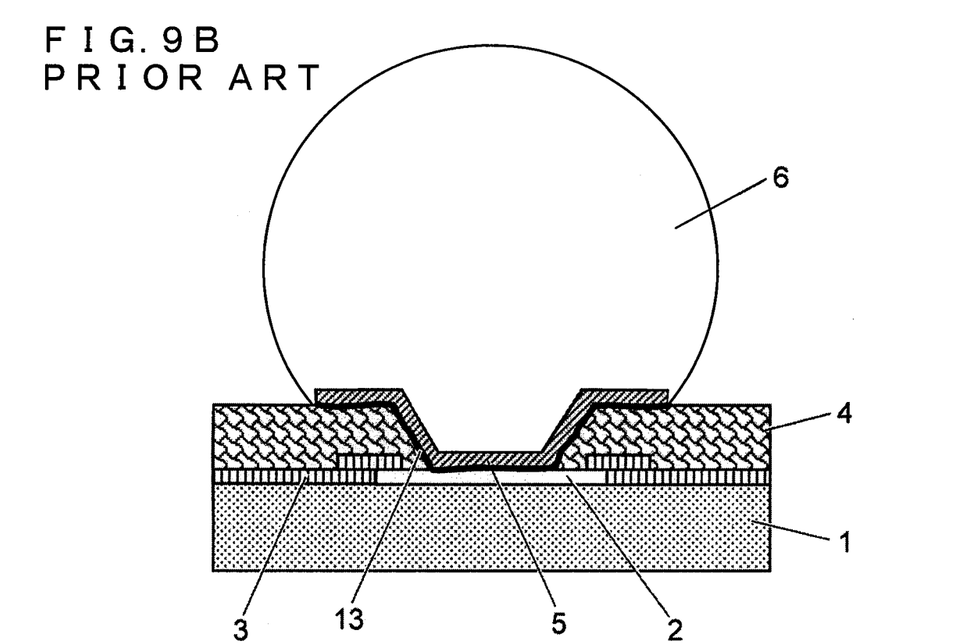

As a constitution provided for controlling the generation of the crack 12 can be mentioned a conventional example 1 recited in the Japanese Patent Document (H04-196392 of the Japanese Patent Applications Laid-Open). The conventional example 1 is described referring to FIGS. 9A-9B. In the conventional example 1, a second insulation film 4 having a relatively large film thickness is formed on a first insulation film 3, and a ground metallic layer 5 having an uneven shape is formed between the second insulation film 4 and an electrode pad 2. The formation of the second insulation film 4 serves to reduce the crack in an interface of the ground metallic layer 5 starting from the end portions thereof. However, the crack 12 resulting from the concentration of the stress in the end portions of the ground metallic layer 5 still cannot be controlled effectively enough. Further, peeling 13 (see the bold line) is likely to occur because a bonding strength between the ground metallic layer 5 and the insulation film 4 is inadequate and a mechanical strength of the bump root portion is insufficient since the position of the end portions of the ground metallic layer 5 is higher than that of a central portion thereof. Further, this constitution is also characterized in that the electrode pad 2 is not present immediately below the end portions of the ground metallic layer 5.

Figure 10:
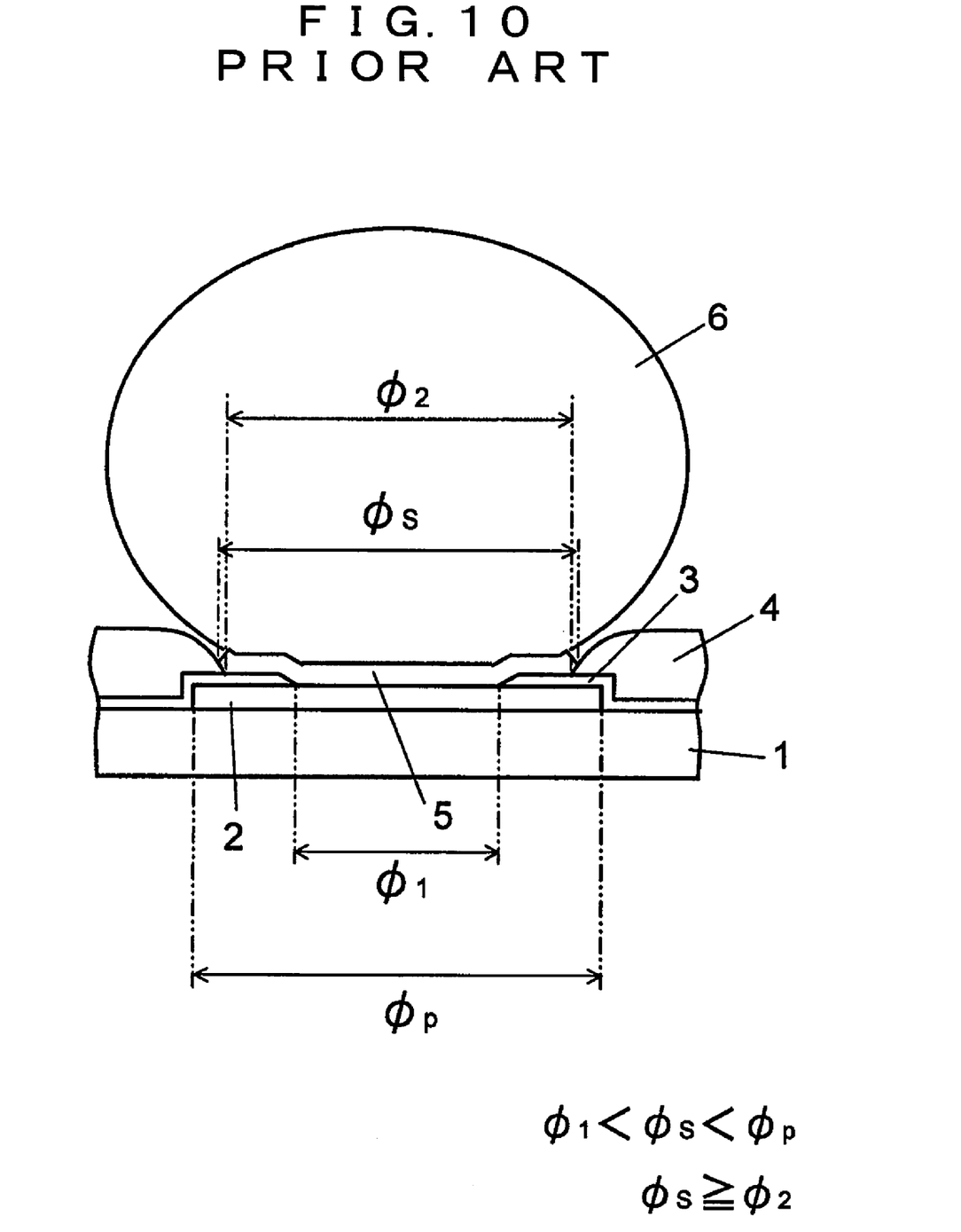
FIG. 10 is a sectional view of still another conventional electrode structure in a semiconductor device.

As another constitution provided for controlling the generation of the crack 12 can be mentioned a conventional example 2 recited in the Japanese Patent Document (H2004-19550 of the Japanese Patent Applications Laid-Open). The conventional example 2 is described referring to FIG. 10. In the conventional example 2, openings of a first insulation film 3 and a second insulation film 4 have a slope shape, which serves to reduce the peeling starting from the end portions of the ground metallic layer 5. However, in the conventional example 2, wherein the end portions of the ground metallic layer 5 still extend upon the first insulation film 3, a bonding strength between the ground metallic layer 5 and the first insulation film 3 is inadequate, and the peeling cannot be completely controlled. Further, a gap between the root portion of the metallic bump 6 and the second insulation film 4 is reduced to the minimum, which may have such structural disadvantages as described below, significantly affecting the reliability of the semiconductor device:

the gap cannot be filled with the under-fill resin; and
the gap cannot be filled with filler contained in the under-fill resin.

The conventional examples 1 and 2 include the following disadvantage in addition to the inconveniences mentioned earlier. As a semiconductor manufacturing process has been remarkably advanced in recent years, the structure of the semiconductor chip is increasingly miniaturized and highly-integrated. As a result, a copper wiring having a relatively small resistance is often used as a wiring material, and a material having a low dielectric constant (low-k) is also often used as an inter-layer insulation film. However, the material having a low dielectric constant is inferior in mechanical strength. When these materials are used in the conventional examples 1 and 2, therefore, the crack and the peeling are more likely to occur in any film having a low dielectric constant used in the semiconductor device on which the semiconductor chips have been mounted.

SUMMARY OF THE INVENTION

Therefore, a main object of the present invention is to provide an electrode structure in a semiconductor device capable of reliably controlling the generation of crack and peeling in a pad area.

An electrode structure in a semiconductor device according to the present invention comprises a semiconductor chip comprising an electrode pad;

a first insulation film having a first opening and provided on the electrode pad;

a second insulation film having a second opening and provided on the first insulation film;

a ground metallic layer provided on the first insulation film and in contact with the electrode pad via the first opening; and a bump mechanically and electrically connected to the ground metallic layer, wherein the ground metallic layer is provided in an opening of the second opening, and the ground metallic layer is provided on an inner side than an outer periphery of the electrode pad, covering the first opening.

More specifically describing the constitution according to the present invention, an outer peripheral diameter of the ground metallic layer is smaller than an outer peripheral diameter of the electrode pad and larger than an opening diameter of the first opening, and an opening diameter of the second opening is larger than the outer peripheral diameter of the ground metallic layer.

When the outer peripheral diameter of the ground metallic layer is set to $\phi_s$, the outer peripheral diameter of the electrode pad is set to $\phi_p$, the opening diameter of the first opening is set to $\phi_1$, and the opening diameter of the second opening is set to $\phi_2$ in order for the constitution to be more easily comprehended, the present invention is characterized in that $\phi_1 < \phi_s < \phi_p$ and $\phi_s < \phi_2$.

In contrast to that, $\phi_1 < \phi_s < \phi_p$; however, $\phi_s \geqq \phi_2$ in the constitution according to the conventional example. The former conditional expression is true of the present invention and the conventional example 2; however, the latter conditional expression is inverted. The present invention is characterized in that the opening diameter $\phi_2$ of the second opening is larger than the outer peripheral diameter $\phi_s$ of the ground metallic layer ($\phi_s < \phi_2$) as against the conventional example 2.

Because the opening diameter $\phi_2$ of the second opening in the second insulation film surrounding an outer-peripheral side of the metallic bump is larger than the outer peripheral diameter $\phi_s$ of the ground metallic layer to which the metallic bump is directly connected. Therefore, a relatively large gap can be secured between a root portion of the metallic bump and the second insulation film, and the relatively large gap can be favorably and sufficiently filled with under-fill resin. Thus, the conventional problem, which is the failure to fill the gap with the under-fill resin, can be solved. Further, the problem that the gap is filled with only the resin but not the filler can also be solved. As a result, the gap can be successfully filled with the filler as well as the resin.

When the semiconductor device is subjected to the thermal history or the like, stress is applied to the root portion of the metallic bump due to a difference in thermal expansion coefficients between the semiconductor chip and the wiring substrate. However, a stress releasing effect by the under-fill resin and the filler can be fully exerted because the second insulation film is present in the outer periphery of the root portion of the metallic bump and the gap, which is relatively large, between the root portion of the metallic bump and the second insulation film is sufficiently filled with the under-fill resin. As a result, the generation of crack and peeling can be controlled in a circuit unit in the periphery of the electrode pad.

Further, in a semiconductor device wherein a material having a low dielectric constant, which is believed to have an insufficient mechanical strength, is used as an inter-layer insulation film, the generation of crack and peeling resulting from a film having the low dielectric constant can be controlled after the mounting process.

The outer peripheral diameter $\phi_p$ of the electrode pad is larger than the outer peripheral diameter $\phi_s$ of the ground metallic layer so that the electrode pad is present immediately below end portions of the ground metallic layer. Therefore, when stress is centered on the end portions, the electrode pad supports the stress, which effectively prevents the transmission of the stress into the semiconductor chip.

As a result of these effects synergically exerted, the generation of crack which may develop into the semiconductor chip can be controlled, and the film having the low dielectric constant can be prevented from being peeled off. In summary, according to the electrode structure in the semiconductor device of the present invention, the crack in the electrode pad and the peeling of the film can be reliably controlled in the semiconductor device in which the semiconductor chip and the wiring substrate are mechanically and electrically connected to each other via metallic bumps made of solder and the gap between the semiconductor chip and the wiring substrate is filled with the under-fill resin. As a result, the reliability of the semiconductor device can be improved.

In the semiconductor device according to the foregoing constitution, the opening diameter of the second opening may be smaller than the outer peripheral diameter of the electrode pad, that is, $\phi_2 < \phi_p$. Thus constituted, when stress is centered on an opening end of the second opening, the electrode pad present immediately below the opening end supports the stress, which makes it difficult for the stress to be transmitted into the semiconductor chip. As a result, the generation of crack which may develop into the semiconductor chip can be controlled, and the film having the low dielectric constant can be prevented from being peeled off.

In the electrode structure in the semiconductor device according to the foregoing constitution, the opening diameter of the second opening may be at least 1.1 times as large as the outer peripheral diameter of the ground metallic layer, that is, $\phi_2 \geqq 1.1 \times \phi_p$. Thus constituted, a large gap can be reliably secured between the root portion of the metallic bump to be joined with the ground metallic layer and the second insulation film to ensure that the root portion of the metallic bump is filled with the under-fill resin and the filler.

In the electrode structure in the semiconductor device according to the foregoing constitution, a film thickness of the first insulation film is preferably at most 1 μm. Thus constituted, a height difference between a section where the ground metallic layer is located above the first insulation film and a section where it is not located above the first insulation film is reduced. As a result, peeling-off of the ground metallic layer and the first insulation film can be controlled.

In a semiconductor wafer according to the present invention, a plurality of semiconductor chips having any of the electrode structures thus far described are formed.

In a semiconductor device according to the present invention, the semiconductor chip having any of the electrode structures thus far described is flip-chip-mounted on the wiring substrate, and the gap between the semiconductor chip and the wiring substrate is filled with the under-fill resin. An electronic device according to the present invention is provided with the semiconductor device thus constituted. Accordingly, the generation of crack and peeling in the vicinity of the electrode pad and in the peripheral circuit unit can be controlled. As a result, a semiconductor device which is highly reliable and the electronic device provided with such a semiconductor device can be obtained.

According to the present invention, wherein the opening diameter of the second opening is larger than the outer peripheral diameter of the ground metallic layer, the generation of crack and peeling at the circuit unit in the vicinity of the electrode pad can be surely controlled, which consequently improves the reliability of the semiconductor device.

The electrode structure in the semiconductor device according to the present invention, wherein the generation of crack and peeling in the vicinity of the electrode pad and in the peripheral circuit unit can be controlled, is useful as a technology for manufacturing a highly reliable semiconductor device at a good yielding ratio.

BRIEF DESCRIPTION OF THE DRAWINGS

These and other objects as well as advantages of the invention will become clear by the following description of preferred embodiments of the invention and will be specified in the claims attached hereto. A number of benefits not recited in this specification will come to the attention of the skilled in the art upon the implementation of the present invention.

DETAILED DESCRIPTION OF THE INVENTION

Hereinafter, preferred embodiments of an electrode structure in a semiconductor device according to the present invention are described in detail referring to the drawings.

Preferred Embodiment 1

Figure 1:
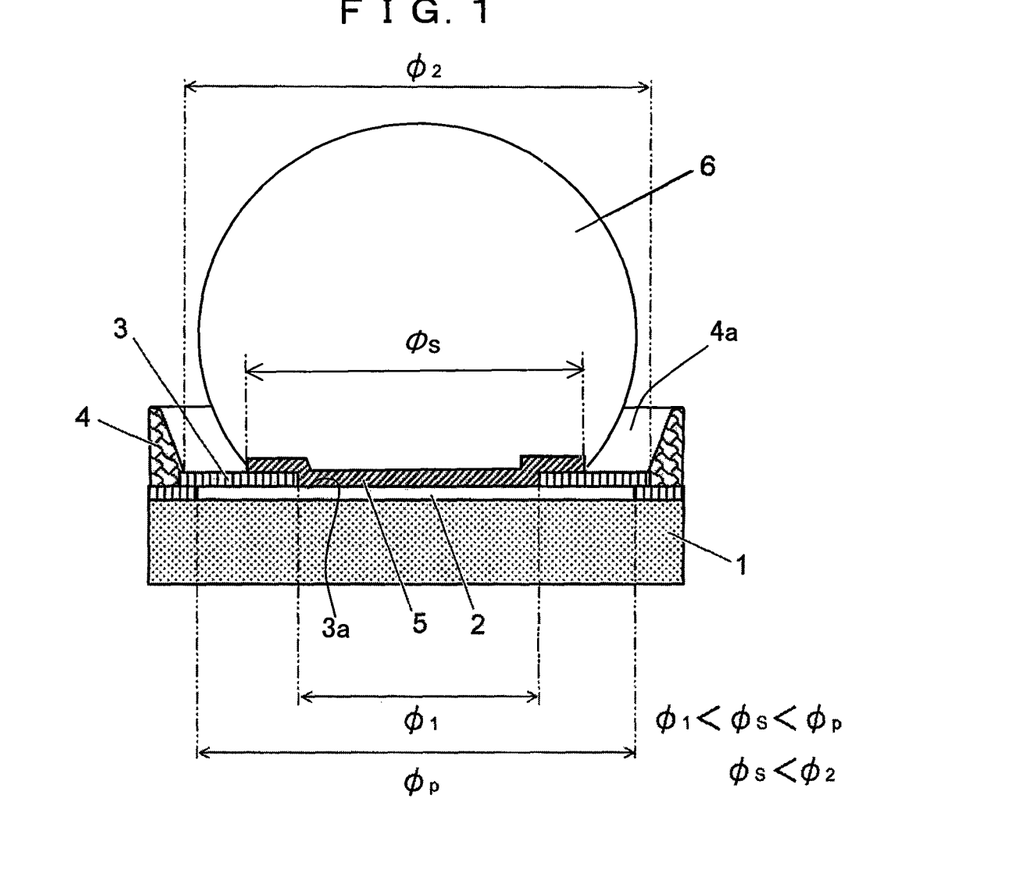
FIG. 1 is a sectional view illustrating an electrode structure in a semiconductor device according to a preferred embodiment 1 of the present invention.

FIG. 1 is a sectional view illustrating an electrode structure in a semiconductor device according to a preferred embodiment 1 of the present invention. As shown in FIG. 1, in a semiconductor chip 1, an electrode pad made of a plurality of semiconductor elements and aluminum (Al) electrically connected to the plurality of semiconductor elements is provided and a first insulation film 3 having a first opening 3a and made of silicon nitride is formed above the electrode pad 2. Further, a second insulation film 4 having a second opening 4a on the first insulation film 3 and made of polyimide is further formed above the first insulation film 3. The second insulation film 4 is formed in the outside vicinity of the electrode pad 2 in a way that it surrounding the electrode pad 2. A ground metallic layer 5 is formed on an area above the electrode pad 2 which includes an upper portion of the first insulation film 3 and the opening 3a. A lower metallic film and an upper metallic film constitute the ground metallic layer 5. The lower metallic film consists of barrier metal made of titanium (Ti) and copper (Cu). The barrier metal is formed by means of, for example, the sputtering method. The upper metallic film is provided on the lower metallic film. The upper metallic film is made of nickel (Ni) obtained by means of the electroplating method. The ground metallic layer 5 is in contact with the electrode pad 2 via the opening 3a and is thereby electrically connected thereto. A metallic bump 6 made of solder is provided on the ground metallic layer 5. The metallic bump 6 is mechanically and electrically connected to the ground metallic layer 5.

The material constituting the first insulation film 3 is not necessarily limited to silicon nitride, and silicon oxide, polyimide, or the like may be used. The material constituting the second insulation film 4 is not necessarily limited to polyimide, and a BCB (benzocyclobutene) film or the like may be used. The material constituting the barrier metal of the ground metallic layer 5 is not necessarily limited to titanium (Ti), and any material which can be strongly bonded to the first insulation film 3 may be used. For example, titanium/tungsten (TiW), chrome (Cr), or the like may be used. Further, the constituent element of the ground metallic layer 5 is not necessarily limited to copper (Cu), and any conductive material may be used. The ground metallic layer 5 is formed by means of the sputtering method and the electroplating method in the present preferred embodiment; however, its forming method is not restrictive, and nickel (Ni) may be directly formed on the electrode pad made of aluminum (Al) by means of, for example, the electroless plating method.

In the electrode structure in the semiconductor device thus constituted according to the present preferred embodiment, the ground metallic layer 5 is provided in the second opening 4a and provided on an inner side than an outer periphery of the electrode pad 2, covering the first opening 3a. More specifically, a chip-side root portion of the metallic bump 6 is formed above the first insulation film 3, and an outer peripheral diameter $\phi_s$ of the ground metallic layer 5 is smaller than an outer peripheral diameter $\phi_p$ of the electrode pad 2, larger than an opening diameter $\phi_1$ of the first opening 3a, and smaller than an opening diameter $\phi_2$ of the second opening 4a. The conditional expression in this case is $\phi_1 < \phi_s < \phi_p$ and $\phi_s < \phi_2$.

The outer peripheral diameter $\phi_p$ of the electrode pad 2 is larger than the outer peripheral diameter $\phi_s$ of the ground metallic layer 5, and the electrode pad 2 is present immediately below end portions of the ground metallic layer 5. Accordingly, when stress is centered on the end portions of the ground metallic layer 5, the electrode pad 2 supports the stress and the transmission of the stress into the semiconductor chip 1 is thereby prevented. As a result, such a crack that develops into the semiconductor chip 1 can be controlled and a film having a low dielectric constant can be prevented from peeling off. A similar effect can be exerted against the stress applied when the semiconductor chip 1 is flip-chip-mounted on a wiring substrate 7 and under-fill resin 8 is supplied thereto.

Further, the following effect can be exerted because the opening diameter $\phi_2$ of the second opening 4a is larger than the outer peripheral diameter $\phi_s$ of the ground metallic layer 5. When the semiconductor device is subjected to the thermal history or the like, stress is applied to the root portion of the metallic bump 6 due to a difference in thermal expansion coefficients between the semiconductor chip 1 and the wiring substrate 7. However, a stress releasing effect by the under-fill resin 8 and filler element can be fully exerted because the second insulation film 4 is present in the outer periphery of the root portion of the metallic bump 6, and a relatively large gap between the root portion of the metallic bump 6 and the second insulation film 4 is sufficiently filled with the under-fill resin 8. As a result, the crack and the peeling-off can be prevented in a circuit unit in the periphery of the electrode pad 2.

Further, in a semiconductor chip wherein a material having a low dielectric constant, which is believed to have an insufficient mechanical strength, is used as an inter-layer insulation film, the crack and the peeling-off which is likely to occur in a film having a low dielectric constant after the semiconductor chip is mounted can be prevented.

Figure 2:
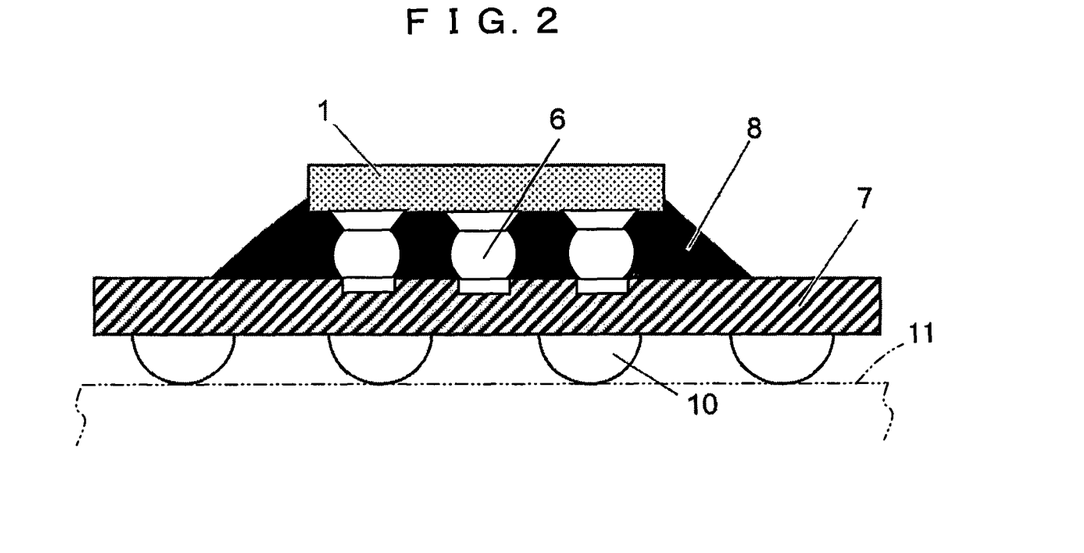
FIG. 2 is a sectional view illustrating a state where a semiconductor chip according to the preferred embodiment 1 is flip-chip-mounted on a wiring substrate and under-fill resin is supplied thereto.

FIG. 2 is a sectional view illustrating a state where the semiconductor chip 1 shown in FIG. 1 is flip-chip-mounted on the wiring substrate 7 and the under-fill resin 8 is supplied thereto. The semiconductor device is provided with BGA balls 10 on its surface which is the underside of the surface provided with the semiconductor chip. The semiconductor device is mounted on a device main body 11 of an electronic device via the BGA balls 10.

Preferred Embodiment 2

Figure 3:
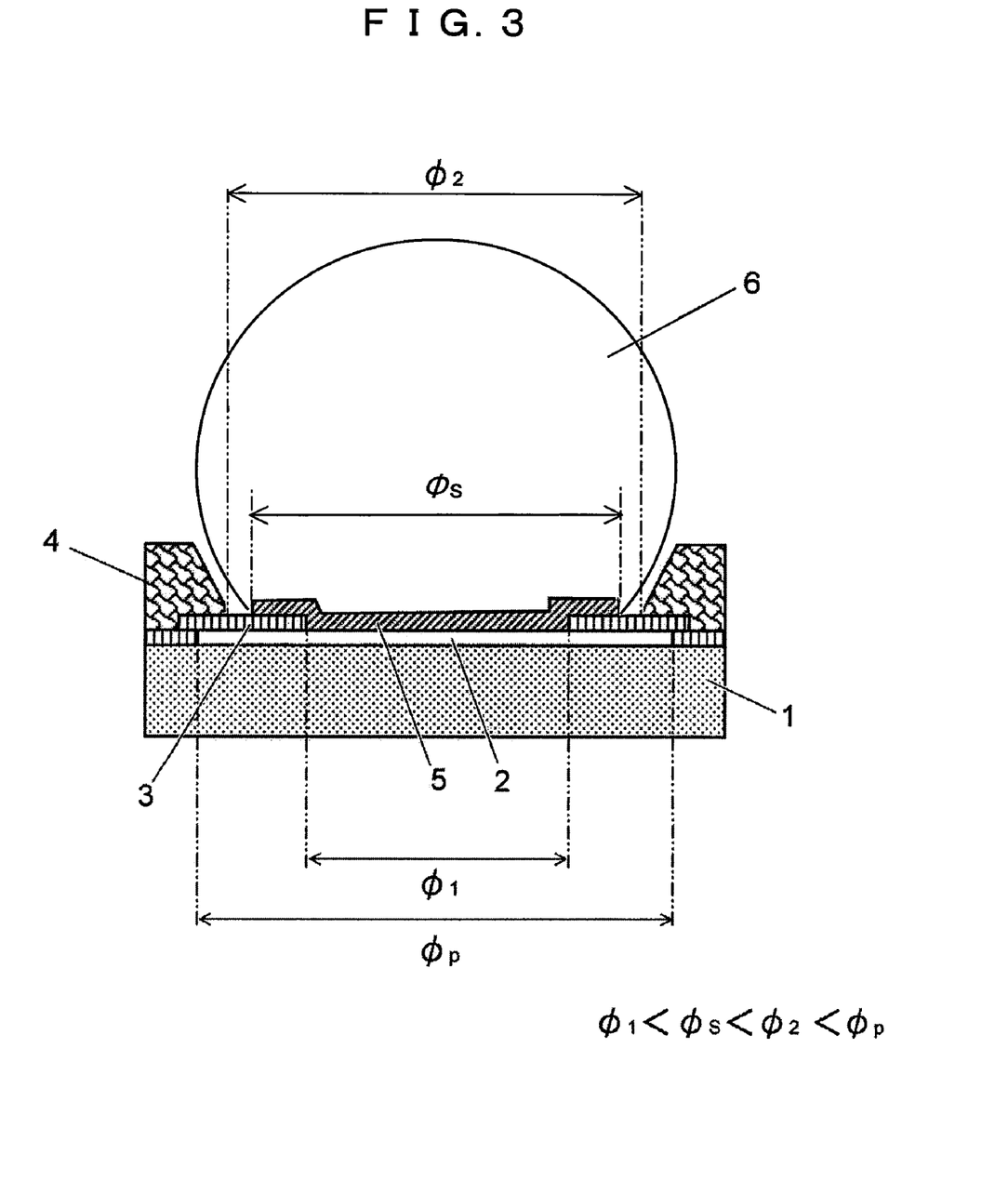
FIG. 3 is a sectional view illustrating an electrode structure in a semiconductor device according to a preferred embodiment 2 of the present invention.

FIG. 3 is a sectional view illustrating an electrode structure in a semiconductor device according to a preferred embodiment 2 of the present invention. In FIG. 3, the same reference symbols as in FIG. 1 for the preferred embodiment 1 denote the same components. The constitution according to the present preferred embodiment is characterized as follows.

The opening diameter $\phi_2$ of the second opening 4a is smaller than the outer peripheral diameter $\phi_p$ of the electrode pad 2, that is, $\phi_2 < \phi_p$. The present preferred embodiment follows the first conditional expression $\phi_1 < \phi_s < \phi_p$ and the second conditional expression $\phi_s < \phi_2$. Therefore, when all of these conditional expressions are organized, the conditional expression according to the present preferred embodiment results in $\phi_1 < \phi_s < \phi_2 < \phi_p$. The description of the rest of the constitution, which is similar to that of the preferred embodiment 1, is omitted.

In the present preferred embodiment, wherein the electrode pad 2 is present immediately below an opening end of the second opening 4a, the electrode pad 2 supports stress when the stress is centered on the opening end of the second opening 4a, which makes it difficult for the stress to be transmitted into the semiconductor chip 1. As a result, such a crack that develops into the semiconductor chip 1 can be controlled and the film having a low dielectric constant can be prevented from being peeled off. Other effects are similar to those described in the preferred embodiment 1.

Preferred Embodiment 3

Figure 4:
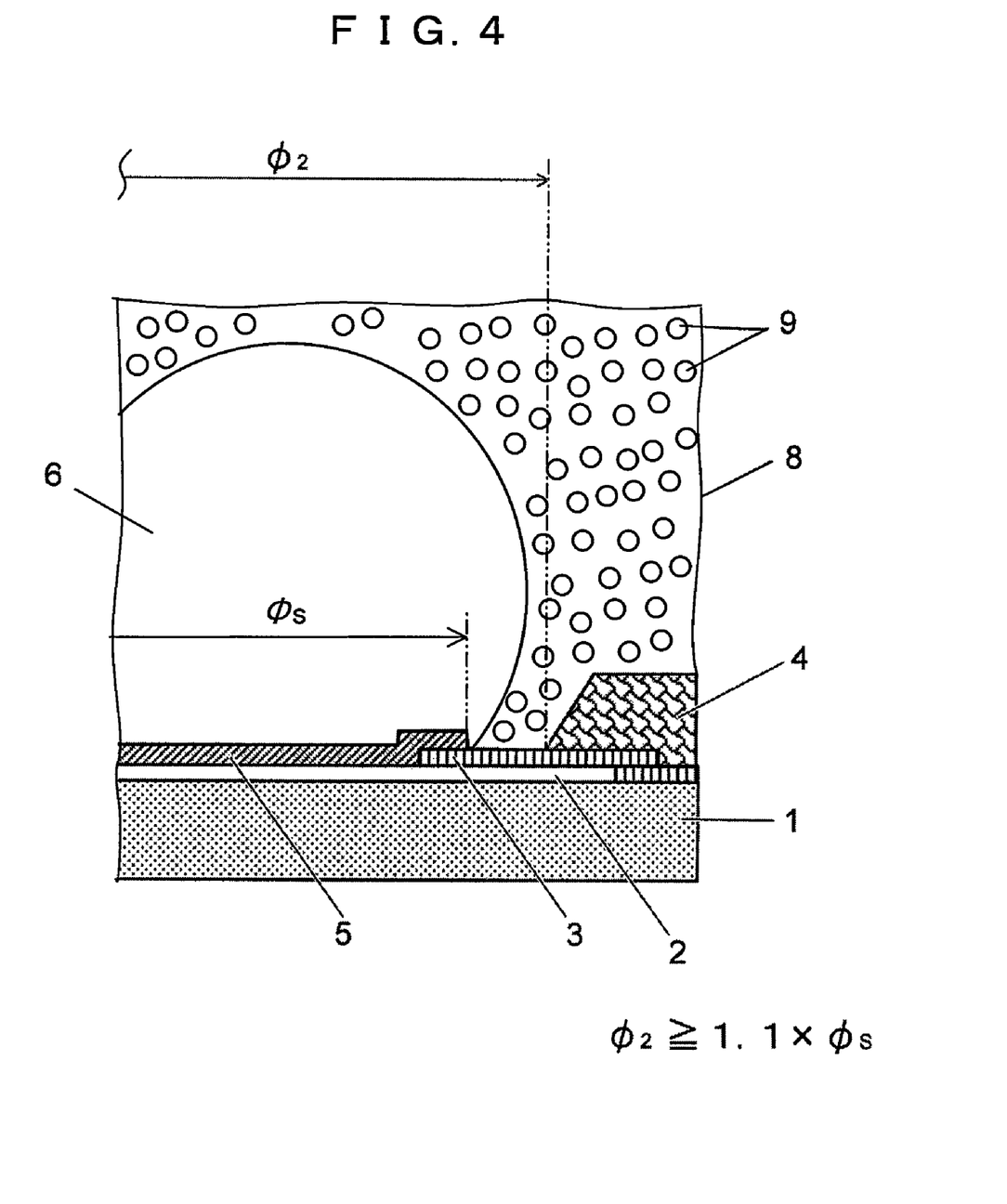
FIG. 4 is a sectional view illustrating an electrode structure in a semiconductor device according to a preferred embodiment 3 of the present invention.

FIG. 4 is a sectional view illustrating an electrode structure in a semiconductor device according to a preferred embodiment 3 of the present invention. In FIG. 4, the same reference symbols as in FIG. 1 for the preferred embodiment 1 denote the same components. The constitution according to the present preferred embodiment is characterized as follows. The opening diameter $\phi_2$ of the second opening 4a is at least 1.1 times as large as the outer peripheral diameter $\phi_s$ of the ground metallic layer 5, that is, $\phi_2 \geq 1.1 \times \phi_s$. The description of the rest of the constitution, which is similar to that of the preferred embodiment 1, is omitted.

When pitches of the metallic bumps 6 are reduced, the gap between the semiconductor chip 1 and the wiring substrate 7 created after they are connected to each other is narrower. Therefore, diameters of the filler 9 are also proportionally reduced in order to ensure the reliability of the injection of the under-fill resin 8. The inventors of the present invention confirmed through experiments that $\phi_2 \geq 1.1 \times \phi_s$ was a prerequisite for the gap between the metallic bump 6 and the second insulation film 4 to be sufficiently filled with filler 9.

According to the present preferred embodiment, wherein a large gap is secured between the root portion of the metallic bump 6 connected to the ground metallic layer 5 and the second insulation film 4, the root portion of the metallic bump 9 can be reliably filled with the under-fill resin 8 and the filler 9. Other effects are similar to those described in the preferred embodiment 1.

Preferred Embodiment 4

In a preferred embodiment 4 of the present invention, a film thickness of the first insulation film 3 in the preferred embodiments 1-3 is set to at most 1 µm. This is because the inventors of the present invention confirmed through experiments that peeling-off occurred between the ground metallic layer 5 and the first insulation film 3 as illustrated in FIG. 10B and described based on the conventional technology in the case where a height difference between a section where the ground metallic layer 5 is located above the first insulation film 3 and a section where it is not located above on the first insulation film 3 was larger than 1 µm. Therefore, the film thickness of the first insulation film 3 is set to at most 1 µm.

According to the present preferred embodiment, wherein the height difference between a section where the ground metallic layer 5 is located above the first insulation film 3 and a section where it is not located above the first insulation film 3 is limited to at most 1 µm, the occurrence of peeling-off between the ground metallic layer 5 and the first insulation film 3 can be prevented.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. An electrode structure in a semiconductor device comprising:
   a semiconductor chip comprising an electrode pad;
   a first insulation film having a first opening and provided on the electrode pad;
   a second insulation film having a second opening and provided on the first insulation film;
   a ground metallic layer provided on the first insulation film and in contact with the electrode pad via the first opening; and
   a bump mechanically and electrically connected to the ground metallic layer, wherein
   the ground metallic layer is provided in an opening of the second opening,
   the ground metallic layer is provided on an inner side than an outer periphery of the electrode pad, covering the first opening,
   an outer peripheral diameter of the ground metallic layer is smaller than an outer peripheral diameter of the electrode pad and larger than an opening diameter of the first opening,
   an opening diameter of the second opening is larger than the outer peripheral diameter of the ground metallic layer, and
   the opening diameter of the second opening is at least 1.1 times as large as the outer peripheral diameter of the ground metallic layer.

2. The electrode structure in a semiconductor device as claimed in claim 1, wherein the opening diameter of the second opening is smaller than the outer peripheral diameter of the electrode pad.

3. The electrode structure in a semiconductor device as claimed in claim 1, wherein a film thickness of the first insulation film is at most 1 µm.

4. A semiconductor wafer comprising a wafer substrate, wherein
   a plurality of semiconductor chips are provided on the wafer substrate, and
   the semiconductor chips have the electrode structure as claimed in claim 1.

5. A semiconductor device comprising a wiring substrate and a semiconductor chip flip-chip-mounted on the wiring substrate, wherein,
   the semiconductor chip has the electrode structure as claimed in claim 1.

6. The semiconductor device as claimed in claim 5, wherein a gap between the semiconductor chip and the wiring substrate is filled with under-fill resin.

7. An electronic device comprising a device main body and the semiconductor device as claimed in claim 5 mounted on the device main body.

8. The electrode structure in a semiconductor device as claimed in claim 1, wherein the opening diameter of the second opening is larger than an outer peripheral diameter of the electrode pad.

\* \* \* \* \*